(12) United States Patent
Behbahani

(10) Patent No.: US 9,531,389 B1
(45) Date of Patent: Dec. 27, 2016

(54) FRACTIONAL-N SYNTHESIZER VCO COARSE TUNING

(71) Applicant: Farbod Behbahani, Irvine, CA (US)

(72) Inventor: Farbod Behbahani, Irvine, CA (US)

( * ) Notice: Subject to any disclaimer, the term of this patent is extended or adjusted under 35 U.S.C. 154(b) by 0 days.

(21) Appl. No.: 14/486,907

(22) Filed: Sep. 15, 2014

(51) Int. Cl.
| | |
|---|---|
| H03L 5/00 | (2006.01) |
| H03L 7/06 | (2006.01) |
| H03L 7/099 | (2006.01) |
| H03B 5/12 | (2006.01) |
| H03L 7/10 | (2006.01) |

(52) U.S. Cl.
CPC ............ H03L 5/00 (2013.01); H03B 5/1265 (2013.01); H03L 7/06 (2013.01); H03L 7/099 (2013.01); H03L 7/104 (2013.01); *H03B 2201/031* (2013.01)

(58) Field of Classification Search
CPC ... H03B 5/1265; H03B 2201/031; H03L 5/00; H03L 5/02; H03L 7/08; H03L 7/101; H03L 7/104
USPC .................... 331/15, 16, 109, 175, 182, 183
See application file for complete search history.

(56) References Cited

U.S. PATENT DOCUMENTS

| | | | | |
|---|---|---|---|---|
| 6,483,391 B1* | 11/2002 | Magoon et al. | ............... | 331/183 |
| 6,653,908 B1* | 11/2003 | Jones | ............................ | 331/183 |
| 7,026,883 B2* | 4/2006 | Muthali et al. | ............... | 331/183 |
| 7,123,113 B1* | 10/2006 | Brennan et al. | ............... | 331/158 |
| 2005/0206463 A1* | 9/2005 | Godambe et al. | ............... | 331/74 |
| 2006/0077012 A1* | 4/2006 | Shi et al. | ......................... | 331/74 |
| 2006/0091969 A1* | 5/2006 | Kenney et al. | ................ | 331/167 |
| 2006/0152295 A1* | 7/2006 | Miyashita et al. | ............ | 331/185 |
| 2007/0013456 A1* | 1/2007 | Lee et al. | ....................... | 331/182 |
| 2008/0007351 A1* | 1/2008 | Chiu et al. | ....................... | 331/16 |
| 2008/0238559 A1* | 10/2008 | Kuwano | ......................... | 331/109 |
| 2013/0009473 A1* | 1/2013 | Ponton et al. | .................. | 307/43 |
| 2014/0035684 A1* | 2/2014 | Na et al. | .......................... | 331/15 |

\* cited by examiner

*Primary Examiner* — Levi Gannon

(57) ABSTRACT

Adjusting a voltage-controlled oscillator (VCO) accurately and reliably. The voltage-controlled oscillator VCO attempts to generate an output signal with a programmed known frequency. An ALC circuit and a VCTA circuit adjust the VCO's amplitude and frequency. The system alternates making changes between amplitude or frequency, checking at each change what (difficult-to-predict) effect this has had on the output of the VCO. Each time the VCO switched capacitor array setting is changed, a circuit reviews the VCO output, and determines whether the VCO output should be adjusted in amplitude and frequency. The VCO amplitude and the VCO frequency are adjusted in alternating steps, that is, adjusting the VCO frequency, determining if further adjustments are desired, adjusting the VCO amplitude, determining if further adjustments are desired, and repeating until the VCO coarse adjustment has been sufficiently conducted.

20 Claims, 2 Drawing Sheets

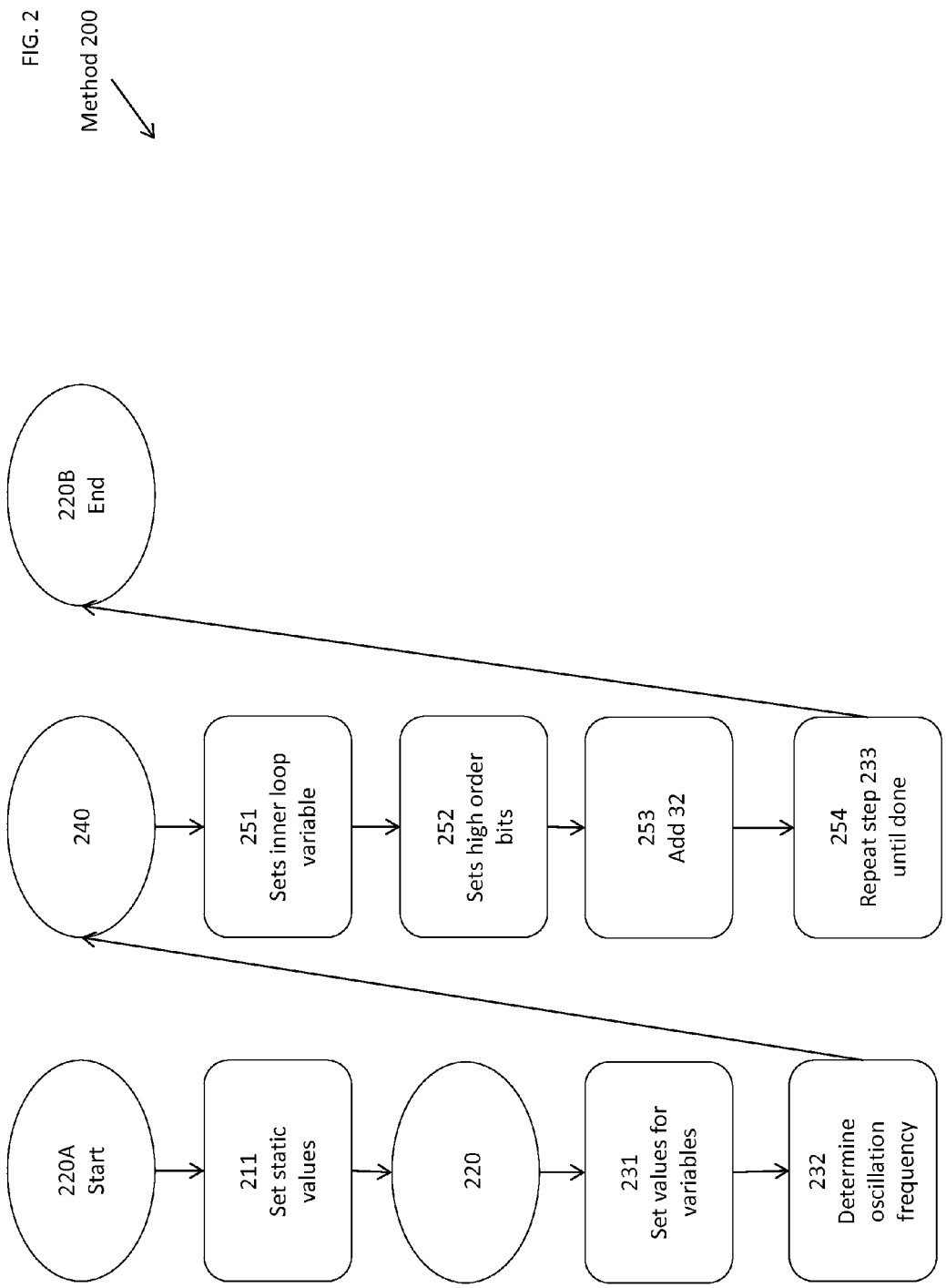

FRACTIONAL-N SYNTHESIZER VCO COARSE TUNING

BACKGROUND

1. Field of the Disclosure

This application generally relates to using a fractional-N synthesizer with tuning of a voltage controlled oscillator (VCO), and other matters.

2. Background of the Disclosure

Some systems using electronic components find it necessary or convenient to generate signals having a programmable known frequency. For example, phase-locked loops (PLL's) are known for use in adjusting the frequency of a first signal to match a second signal frequency or multiples of second signal frequency with a programmable known frequency.

One problem that has arisen in the art is that VCO's often, if not substantially always, need to have their output signal's amplitude adjusted, to avoid generating a signal that is the correct frequency, but is too low in amplitude (that is, not energetic enough) or too high in amplitude (that is, is too energetic). Known systems sometimes address this problem by adjusting the amplitude of the output signal up or down to fall within a range of output signal energy known to be suitable. Fine control of the output signal's frequency could then be adjusted with PLL's or similar electronic circuitry. Mechanisms which continuously control and adjust the VCO amplitude often add noise to the VCO. For this reason, it would be better to set the amplitude of the VCO discretely in time. However, amplitude of oscillation in the VCO will also depend on the VCO frequency. So, if after setting the VCO amplitude, its frequency is change, it will change the amplitude of oscillation too.

While this method of adjusting the amplitude of the output signal up or down to fall within a known range of output signal energy could address some of the problems associated with coarse frequency control, it could also be subject to several drawbacks. A first drawback is that if the output signal's energy is too high, the transistors and capacitors in the VCO could work in a region that harms them. An aspect of this problem is that of possibly damaging the electronic circuitry, either in the VCO or in the downstream circuitry, such as possibly by overpowering the circuit elements.

A second drawback is that if the output signal's energy is too low, the output signal from the VCO could be insufficiently strong to operate the downstream circuitry, or it may be noisy. An aspect of the problem of adjusting the amplification at the output of the VCO is that lowering the amplified power output to less than a known threshold, alone, might fail to lower the total of a DC bias and the amplified output to less than that known threshold. Thus, with the limitation $V\_DC+V\_AMP<V\_theta$, where $V\_DC$ is a DC voltage, $V\_AMP$ is oscillation amplitude voltage of the VCO, and $V\_theta$ is a threshold voltage. In most cases, the total voltage of $V\_DC+V\_AMP$ defines if the VCO devices are operating in the safe region or not. Therefore, Detecting only $V\_AMP$ to adjusting this voltage may result in an suboptimal amplitude setting for the VCO.

3. Some Drawbacks of the Known Art

Each of these issues, as well as other possible considerations, might cause difficulty in aspects of tuning oscillators, including oscillators designed to output a programmed known frequency, including voltage-controlled oscillators (VCO's).

BRIEF SUMMARY OF THE DISCLOSURE

This application provides systems and techniques that can adjust a voltage-controlled oscillator (VCO) more accurately and more reliably than the known art.

In one embodiment, a voltage-controlled oscillator VCO receives an input (such as in the form of instructions or signals), in response to which the VCO attempts to generate an output signal with a programmed known frequency. An automatic level control (ALC) circuit and a VCO coarse tuning adjustment (VCTA) circuit can direct the VCO to adjust its amplitude, frequency, other aspects of its generated signal, and combinations or conjunctions thereof. Because, as described herein, the VCO can be sensitive in relatively nonlinear and difficult-to-predict ways when the amplitude or frequency (or both) are changed, the system alternates making changes between amplitude or frequency, checking at each change what (difficult-to-predict) effect this has had on the output of the VCO.

In one embodiment, a peak detector receives the VCO's output signal, and determines maximum voltage at circuit node (such as VCO output nodes) in a time domain. In response to the output signal from the peak detector, an automatic level control (ALC) circuit generates control signals directed to the VCO, adjusting a parameter in the VCO (such as but not limited to bias current) to set the voltage of the sensitive node (e.g. VCO output) to the desired region.

As described herein, the VCO amplitude and the VCO frequency can be interdependent in difficult-to-predict ways. Accordingly, each time the VCO switched capacitor array setting is changed, a circuit reviews the VCO output, and can determine whether the VCO output should be adjusted in amplitude (as well as) frequency. This can have the effect that, whenever the VCO switched capacitor array setting is changed, the VCO amplitude should also be adjusted, at least a small amount.

As described herein, the VCO amplitude and the VCO frequency can be adjusted in alternating steps, that is, adjusting the VCO frequency, determining if further adjustments are desired, adjusting the VCO amplitude, determining if further adjustments are desired, and repeating until the VCO coarse adjustment has been sufficiently conducted. In one embodiment, the VCO coarse adjustment has been sufficiently conducted when VCO fine adjustment (that is, use of a PLL circuit) can be used to adjust the output frequency to a specified degree of tolerance.

This Application.

After reading this application, those skilled in the art would recognize that techniques shown in this application are applicable to more than just the specific embodiments shown herein. For a first example, the concept of oscillators is intended to be broad, and could include those that can generate sine waves, square waves, and combinations or conjunctions thereof. For a second example, the concepts of amplitude and frequency are intended to be broad, and can include amplitudes at specific frequencies, harmonics thereof, and combinations or conjunctions thereof. For a third example, the concepts of amplitude and frequency are intended to be broad, and can include wavelets, orthogonal (or substantially-orthogonal, or some combination or conjunction thereof) spread-spectrum signals, and combinations or conjunctions thereof.

While multiple embodiments are disclosed, including variations thereof, still other embodiments of the present application will become apparent to those skilled in the art from the following detailed description, which shows and describes illustrative embodiments of the application. The application is capable of modifications in various aspects, all without departing from its scope or spirit. The drawings and detailed description are illustrative in nature and not restrictive.

BRIEF DESCRIPTION OF THE FIGURES

FIG. 2 shows a conceptual drawing of a method.

DETAILED DESCRIPTION OF AN EMBODIMENT

Figures and Text

Figure 1:
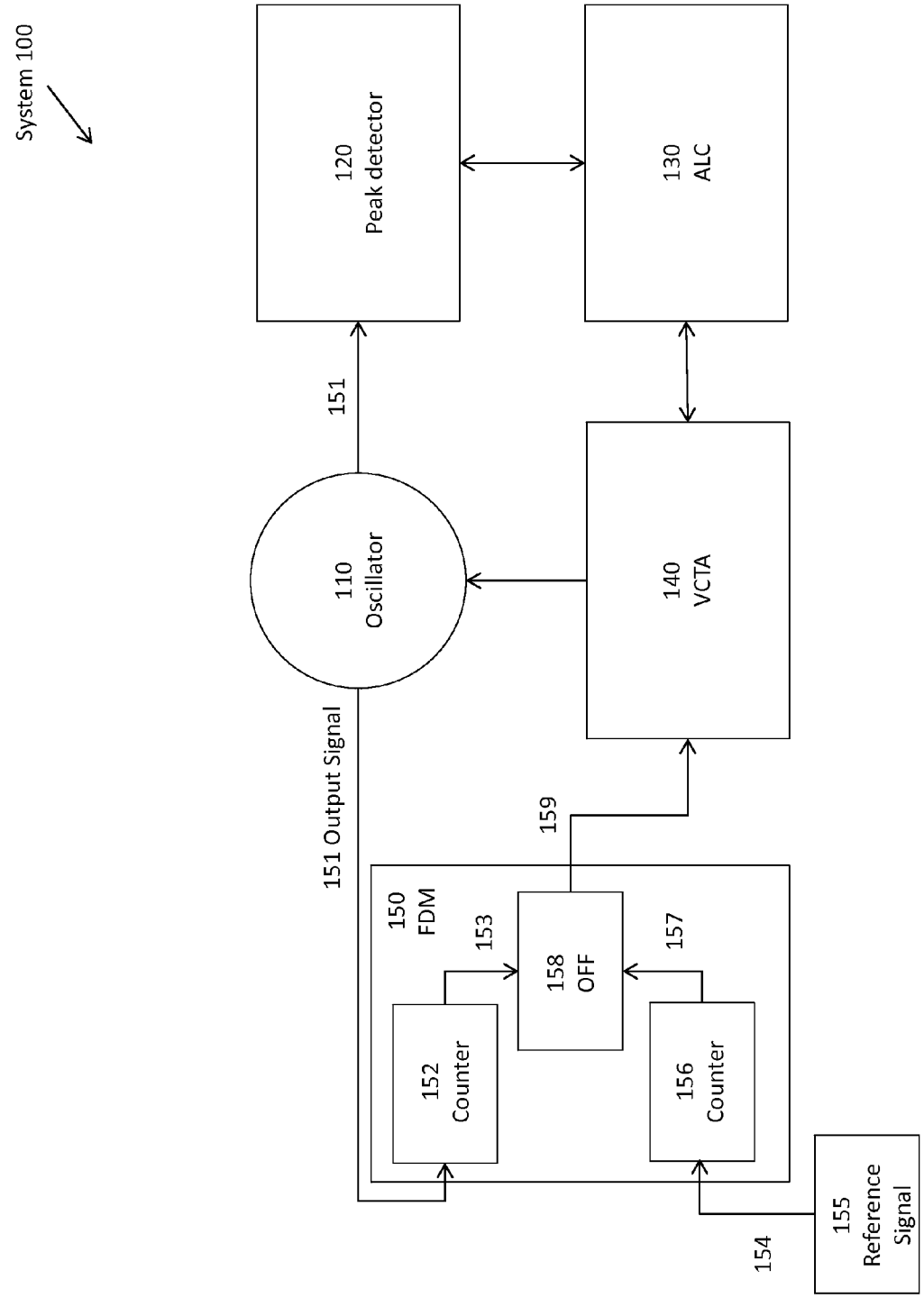
FIG. 1 shows a conceptual drawing of a system.

FIG. 1 shows a conceptual drawing of a system.
FIG. 2 shows a conceptual drawing of a method.

System Overview

FIG. 1 shows a conceptual drawing of a system.

A system 100 includes elements described herein, other elements shown in the figure, and possibly other elements. Not all elements are required; elements should be considered optional, unless otherwise specified or unless clearly obvious to operation of the system.

System Circuit.

In one embodiment, the system 100 can include an oscillator 110 (which can of course be a VCO), a peak detector 120, an automated level control (ALC) circuit 130, a VCO coarse tuning adjustment (VCTA) circuit 140, and a frequency difference measure (FDM) circuit 150. The oscillator 110 provides one or more output signals 151, in this case described as the same output signal 151, which can be coupled to the peak detector 120 and to the FDM circuit 150. The peak detector 120 exchanges information with the ALC circuit 130, which itself also exchanges information with the oscillator 110, the peak detector 120, and the VCTA circuit 140. The VCTA circuit 140 receives information from the FDM circuit 150, and provides an output signal to the oscillator 110, which can have the effect of adjusting the frequency of the oscillator 110. The FDM circuit 150 can include a first input 151 from the oscillator 110, which can be coupled to a first counter 152, such as to count a number of oscillations in a selected time duration, and provide a first output 153 indicating a number thereof, a second input 154 from a reference signal 155 (generally having a predetermined known frequency), which can be coupled to a second counter 156, such as to count a number of oscillations in the same selected time duration, and provide a second output 157 indicating a number thereof. A comparator 158 can receive the first output 153 and the second output 156, and provide a comparison signal 159 indicating a positive or negative difference therebetween.

In one embodiment, the peak detector 120 can determine a local maximum (or in alternative embodiments, a local minimum) of an output signal 151 provided by the oscillator 110. As described herein, the peak detector 120 will generally indicate each time the oscillator 110 provides a local maximum (or in alternative embodiments, a local minimum) in its output signal 151. In one embodiment, the peak detector 120 also detects dropouts, local maxima or minima, and noise, with the effect that the peak detector 120 can provide information with respect to a regularized signal representative of an output frequency of the oscillator 110.

In one embodiment, the ALC circuit 130 can control the amplitude of oscillation of the oscillator 110. In one embodiment, this control can be implemented by changing the bias current of the oscillator. In one embodiment, if the ALC circuit 130 determines that, at peak times for the oscillator 110, the maximum voltage at the oscillator nodes is greater than the oscillator circuit elements can handle, the ALC circuit 130 can reduce the amplitude of oscillation of the oscillator to a degree not greater than the oscillator circuit elements can handle. Similarly, in one embodiment, if the ALC circuit 130 determines that, at some times for the oscillator 110, the amplitude of oscillation of the is less than needed for the oscillator circuit 110 to drive the circuits following the oscillator, the ALC circuit 130 can increase the amplitude of oscillation of the oscillator to a degree where the PLL can be driven properly.

VCO Coarse Tuning Adjustment.

In one embodiment, the VCTA circuit 140 receives information from the FDM circuit 150, such as from the comparison signal 159, indicating whether and to what degree the oscillator 110 frequency should be reduced or increased. As the amplitude and frequency of oscillation in an oscillator affect each other, it is important to adjust the amplitude (through ALC) for each step of VTCA (which changes the frequency). The VCTA circuit 140 performs the method 200 as described herein with respect to FIG. 2, with the effect of alternately adjusting the amplitude and operating frequency of the oscillator 110, so as to reach an operating frequency sufficiently near the target operating frequency that the PLL can perform fine adjustment of the operating frequency of the oscillator 110. An output 141 of the VCTA circuit 140 provides an input to the oscillator 110, so as to prompt the oscillator 110 to be adjusted in frequency.

Method of Operation

FIG. 2 shows a conceptual drawing of a method.

A method 200 includes flow points and method steps as described herein. These flow points and method steps are, by the nature of the written word, described in a particular order. This description does not limit the method to this particular order. They might be performed in a different order, or concurrently, or partially concurrently, or otherwise in a parallel, pipelined, quasi-parallel, or other manner. They might be performed in part, paused, and returned to for completion. They might be performed as co-routines or otherwise. In the context of the invention, there is no particular reason for any such limitation.

One or more portions of the method 200 are sometimes described as being performed by particular elements of the system 100 described with respect to FIG. 1, or sometimes by "the method" itself. When a flow point or method step is described as being performed by "the method," it can be performed by one or more of those elements, by one or more portions of those elements, by an element not described with respect to the figure, by a combination or conjunction thereof, or otherwise.

Beginning of Method

A flow point 200A indicates a beginning of the method.

In one embodiment, the VCTA circuit 140 sets the values of the switched capacitors of the oscillator (VCO) 110 to a set of initial values. Having set the switched capacitors to initial values, the ALC circuit 130 sets the inputs to the oscillator 110 and sets its oscillation amplitude (for example to select the optimal phase noise ("jitter")). In one embodiment, the ALC circuit 130 detects maximum voltages across the oscillator 110 transistors and the maximum operating amplitude of the oscillator 110, while attempting to maintain the operating transistors in the oscillator 110 in their permitted operation regions. In one embodiment, the peak detector 120 is maintained coupled to a gate of a main transistor of the oscillator 110, and measuring a maximum voltage of the latter.

In one embodiment, operation of the ALC circuit 130 and the VCTA circuit 140 are substantially interleaved. (While this application is primarily described with "interleaved" generally meaning that the operation of the ALC circuit 130 and the VCTA circuit 140 are alternated, in the context of the invention, there is no particular requirement for any such particular limitation.) For a first example, the ALC circuit 130 could operate at a 3:2 ratio to the operation of the VCTA circuit, that is, the ALC circuit 130 could operate three times for each time the VCTA circuit 140 operates two times. For a second example, the ALC circuit 130 and the VCTA circuit 140 could each operate randomly or pseudo-randomly, with the effect that their operations are approximately interleaved at about a 1:1 ratio.

In one embodiment, between substantial interleaving of the ALC circuit 130 and the VCTA circuit 140, the method 200 waits a programmable or fixed time duration between operations, so as to allow the operation of the oscillator 110 to settle therebetween. In one embodiment, trade-off between a degree of oscillator 110 power supply and a degree of performance can be adjusted in response to a threshold voltage of the peak detector 120.

Initialization

At a step 211, the method 200 sets static values to later be used during operation.

Binary Search

VCTA can be implemented in many different ways. In one embodiment, At a flow point 220, the method 200 is ready to begin a binary search for each bit of the control word "SWC_VCO"<7:0> (as described herein). The method 200 performs the steps between this flow point and the next flow point once for each bit in that control word, starting with the most significant bit (bit 7) and ending with the least significant bit (bit 0). A "working bit" in the control word "SWC_VCO" <7:0> is set to 7, the most significant bit.

At a step 231, the method 200 sets values for two variables, COARSE_STEPDONE (whether the step is completed for setting the coarse value of the oscillator (VCO) 110) and COARSE_COMPO (whether the individual bit is over its desired value or not).

At a step 232, the method 200 detects if the oscillation frequency of the oscillator (VCO) 110 is greater than desired. If not, the method 200 sets the working bit of the control word to logic-high value ("1"), and sets the variable COARSE_COMPO to a logic-high value ("1"). Otherwise, the method 200 sets the working control bit of the control word to logic "0", and sets the variable COARSE_COMPO to logic "1".

Inner Loop

At a flow point 240, the method 200 is ready to adjust the working bit of the control word "SWC_VCO" <7:0> (as described herein).

At a step 251, the method 200 sets a variable to indicate that the "inner loop" is not yet complete. The method 200 also retries the control word "SWC_VCO" <7:0> (as described herein) to determine if the values should get adjusted.

At a step 252, the method 200 sets the high-order (most significant) three bits of the control word to logical "011" and the rest of the bits to logical "0," thus setting the control word to a value of decimal 96.

At a step 253, the method 200 waits a selected time duration, so as to allow the oscillator 110 to settle its operations into an equilibrium state before proceeding.

At a step 254, the method 200 adds decimal 32 to the control word (as described herein), thus increasing the high-order three bits from logical "011" to logical "100" (and so on thereafter). If the value of these bits reaches logical "000," the control word has overflowed, and an error may be considered to have occurred. Otherwise, the method 200 subtracts decimal 32 from the control word (as described herein), thus decreasing the high-order three bits by one, the inverse of the just-described operation.

At a step 255, with the three high-order bits having been set (possibly by overflow or underflow), the method 200 steps down from control bit 4 (decimal value 16) to control bit 0 (decimal value 1), each time repeating the step 253 to wait for the oscillator 110 to settle operations.

After all control bits of the control word "SWC_VCO" <7:0> (as described herein) have been adjusted, the method 200 determines if the control word should be adjusted. If so, the method 200 proceeds at the flow point 220, with the next least-most-significant bit. If not, the method 200 proceeds with the flow point 200B, where it finishes.

End of Method

At a flow point 200B, the method 200 is complete. In one embodiment, the method 200 is repeated each time the oscillator 110 is adjusted.

Alternative Embodiments

While some embodiments are generally described herein with respect to particular devices and method steps, in the context of the invention, there is no particular requirement for any such particular limitation. For example, individual elements or method steps of the described embodiments could be replaced with substitutes that perform similar functions in other contexts. Similarly, while this application is primarily described with respect to VCO's and related devices, in the context of the invention, there is no particular requirement for any such particular limitation. For example, other adjustable devices, particularly those in which there are multivariate inputs and nonlinear effects, can be adjusted using circuits, devices, methods, techniques, and program-instruction media, in which the substantive effect of each of those multivariate inputs or nonlinear effects can be minimized with respect to the adjustment to be performed.

Elements of the system are described herein with respect to one or more possible embodiments, and are not intended to be limiting in any way. In the context of the invention, there is the particular requirement for any such limitations as described with respect to any elements of the system. For example, individual elements of the described apparatuses could be replaced with substitutes that perform similar functions. Moreover, as described herein, many individual elements of the described apparatuses are optional, and are not required for operation.

Although control elements of the one or more described apparatuses are described herein as being executed as if on a single computing device, in the context of the invention, there is no particular requirement for any such limitation. For example, the control elements of the one or more described apparatuses can include more than one computing device, not necessarily all similar, on which the element's functions are performed.

Certain aspects of the embodiments described in the present disclosure may be provided as a computer program product, or software, that may include, for example, a computer-readable storage medium or a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular embodiments. Functionality may be separated or combined in procedures differently in various embodiments of the disclosure or described with different terminology. These and other variations, modifications, additions, and improvements may fall within the scope of the disclosure and the inventive subject matter.

The invention claimed is:

1. A method of adjusting a voltage controlled oscillator (VCO), said method including steps of
 receiving an input directing said VCO to generate an output signal, said output signal having a programmable known output frequency, and an output amplitude within a known range;
 first adjusting a first operating parameter of said VCO, said first operating parameter including said output amplitude, and determining an effect of said steps of first adjusting on at least two first operating parameters of said VCO, said at least two first operating parameters including said amplitude and frequency;
 second adjusting a second operating parameter of said VCO, said second operating parameter including said output frequency, and determining an effect of said steps of second adjusting on at least two second operating parameters of said VCO, said at least two second operating parameters including said amplitude and frequency; and
 repeatedly interleaving said steps of first adjusting and second adjusting, said steps of interleaving including performing one or more steps of delaying first and second adjusting until the VCO reaches an equilibrium state, said first adjusting in response to said second adjusting, and performing one or more steps of said second adjusting in response to said first adjusting; wherein said steps of repeatedly interleaving are performed until a known terminating condition.

2. A method as in claim 1, including steps of
 coupling said output signal to a peak detector, said peak detector providing an indicator of a extreme operating amplitude of said VCO, said extreme operating amplitude including at least a minimum or a maximum operating amplitude; and
 in response to said output signal and said extreme operating amplitude, providing one or more control signals to the VCO, said control signals adjusting one or more said operating parameters, said operating parameters including a bias.

3. A method as in claim 1, wherein
 at least some times when said amplitude is adjusted, a first circuit determines whether said frequency should thereafter be adjusted; and
 at least some times when said frequency is adjusted, a second circuit determines whether said amplitude should thereafter be adjusted.

4. A method as in claim 1, wherein
 said at least two first operating parameters, or said at least two second operating parameters, include one or more of: signal dropout or noise.

5. A method as in claim 1, wherein
 said steps of interleaving include performing said steps of first adjusting and second adjusting alternately.

6. A method as in claim 1, wherein
 said steps of interleaving include performing said steps of first adjusting and second adjusting alternately at a ratio of other than 1:1.

7. A method as in claim 1, wherein
 said steps of interleaving include performing said steps of first adjusting and second adjusting alternately in response to a random or pseudo-random process.

8. A method as in claim 7, wherein
 said random or pseudo-random process is disposed to average to a predetermined known ratio.

9. A method as in claim 1, wherein
 said VCO includes a switched capacitor array, said array being associated with one or more array bits; and
 said settings are adjusted in an order having at least one of: a most significant bit (MSB) first, or a least significant bit (LSB) last.

10. A method as in claim 1, wherein
 said VCO includes a switched capacitor array, said array having one or more settings; and
 at least some times when said settings are adjusted, a circuit determines whether at least one operating parameter of said VCO should be adjusted, said at least one operating parameter including said amplitude or frequency.

11. A method as in claim 1, wherein
 said steps of repeatedly interleaving are performed at least until one or more said operating parameters of said VCO are adjusted sufficiently that said VCO can be maintained at said known frequency by a selected circuit, said selected circuit including a phase locked loop (PLL).

12. A method as in claim 1, wherein
 said steps of repeatedly interleaving move a set of operating parameters of said VCO into a realm wherein a PLL can perform fine adjustment on said operating parameters to achieve a desired VCO operating frequency.

13. Apparatus including
 a voltage controlled oscillator (VCO), said VCO including a switched capacitor array;
 a peak detector coupled to an output of said VCO, and disposed to provide a first signal, indicating one or more of: a VCO operating amplitude, a VCO operating frequency, another operating parameter of said VCO;
 an automated level control (ALC) element coupled to said peak detector and to an input of said VCO, and disposed to provide a second signal, indicating one or more of: a bias applicable to said VCO, a target VCO operating amplitude;

a VCO coarse timing adjustment (VCTA) element coupled to said ALC and to an input of said VCO, and disposed to provide a third signal, indicating one or more of: a target VCO operating frequency, a target setting for a switched capacitor array;

a signal comparator coupled to a reference signal, an input of said VCTA, and an output of said VCO, and disposed to provide a fourth signal, indicating one or more of: a difference between said VCO operating frequency and a reference signal frequency, a target VCO operating frequency;

wherein said ALC element is responsive to said target VCO operating frequency to adjust said second signal, whereby the VCO operating amplitude is responsive to said target VCO operating frequency;

wherein said VCTA element is responsive to said target VCO operating amplitude to adjust said third signal, whereby the VCO operating frequency is responsive to said target VCO operating amplitude; and including a delay element responsive to at least one of: the ALC element, the VCTA element, disposed to impose a delay between operation of the ALC element and the VCTA element until the VCO reaches an equilibrium state; and a repeat element responsive to a known terminating condition, and disposed to cause the ALC element to operate in response to the VCTA element, and to cause the VCTA element to operate in response to the ALC element, while the known terminating condition has not yet occurred.

14. A apparatus as in claim 13, wherein
said ALC element provides said second signal in response to said peak detector; and said second signal is operative to adjust a VCO operating amplitude.

15. A apparatus as in claim 13, wherein
said second signal provided by said ALC is operative to maintain said VCO operating amplitude; such that a selected known threshold is greater than a sum of a bias and said VCO operating amplitude; wherein said known threshold is sufficiently low that downstream circuits are not damaged by an output of said VCO.

16. A apparatus as in claim 13, wherein
said signal comparator includes
a first counter coupled to said reference signal;
a second counter coupled to an output from said VCO; and
a comparator coupled to said first counter and said second counter.

17. A apparatus as in claim 13, wherein
said first signal provided by said peak detector is responsive to one or more of: a dropout of an output from said VCO; a noise parameter of an output from said VCO.

18. A apparatus as in claim 13, wherein
said first signal provided by said peak detector is responsive to one or more of: a local maximum of an output from said VCO; a local minimum of an output from said VCO; another operating feature of an output from said VCO.

19. A apparatus as in claim 13, wherein
said VCTA element is responsive to one or more instructions, directing said VCTA element to:
adjust said VCO operating amplitude, and receive information about operating parameters of an output from said VCO;
adjust said VCO operating frequency, and receive information about operating parameters of an output from said VCO; and
perform said instructions to adjust said VCO operating amplitude and said VCO operating frequency in an interleaved manner;
wherein said instructions to adjust said VCO operating amplitude and said VCO operating frequency in an interleaved manner move a set of operating parameters of said VCO into a realm wherein a PLL can perform fine adjustment on said operating parameters to achieve a desired VCO operating frequency.

20. A method, including steps of
first adjusting an amplitude associated with an electronically-controlled device in response to a then-current frequency thereof;
second adjusting a frequency associated with the electronically-controlled device in response to a then-current amplitude thereof;
wherein said steps of first and second adjusting are delayed until the electronically-controlled device reaches an equilibrium state;
interleaving and repeating said steps of first adjusting and second adjusting;
whereby said steps of first adjusting and second adjusting are each applied a plurality of times until occurrence of a known terminating condition.

* * * * *